United States Patent
Park et al.

[11] Patent Number: 6,124,208
[45] Date of Patent: Sep. 26, 2000

[54] METHOD OF PREVENTING BOWING IN A VIA FORMATION PROCESS

[75] Inventors: Jae-Hyun Park; Han-Sik Yoon, both of Cheongju, Rep. of Korea

[73] Assignee: Hyundai Electronics Industries Co., Ltd., Kyoungki-do, Rep. of Korea

[21] Appl. No.: 09/186,354

[22] Filed: Nov. 5, 1998

[30] Foreign Application Priority Data

Jan. 15, 1998 [KR] Rep. of Korea ............... 967/1998

[51] Int. Cl.⁷ ............................................. H01L 21/311
[52] U.S. Cl. ................................................. 438/696
[58] Field of Search .......................... 438/696, 782, 438/705, 694, 778, 704

[56] References Cited

U.S. PATENT DOCUMENTS

| | | |
|---|---|---|
| 4,978,420 | 12/1990 | Bach . |
| 5,320,981 | 6/1994 | Blalock . |
| 5,376,223 | 12/1994 | Salimian et al. . |
| 5,432,073 | 7/1995 | Wu et al. . |
| 5,447,613 | 9/1995 | Ouellet . |
| 5,459,086 | 10/1995 | Yang ........................ 438/624 |
| 5,970,376 | 10/1999 | Chen ........................ 438/637 |
| 6,033,990 | 3/2000 | Kishimoto et al. . |
| 6,040,248 | 3/2000 | Chen et al. . |

*Primary Examiner*—Charles Bowers
*Assistant Examiner*—Evan Pert

[57] ABSTRACT

The present invention relates to a method for forming a via which includes: forming a base layer on a semiconductor substrate; forming a conductive layer pattern on the base layer; forming an insulating layer on the base layer having the conductive layer pattern formed thereon; selectively etching the insulating layer in order to form a via exposing an upper surface of the conductive layer pattern; and using an argon (Ar) plasma treatment to form a protective layer on a profile of the via. Also, after using an oxygen plasma treatment to remove a photoresist pattern and remains in the via after the Ar plasma treatment, the protective layer formed on the profile of the via by the Ar plasma treatment prevents the profile of the via contact hole from being bowed, and thus vertically maintains the profile of the via contact hole.

10 Claims, 2 Drawing Sheets

METHOD OF PREVENTING BOWING IN A VIA FORMATION PROCESS

BACKGROUND OF THE INVENTION

1. Field of the Invention

The present invention relates to a semiconductor device, and more particularly to a method for forming a via in a semiconductor manufacturing process, capable of vertically maintaining a profile of a via contact hole by forming a protective film at a side surface of an SOG film, exposed by a via contact hole etching process, by Ar plasma treatment in order to prevent an undercut profile of the via contact hole from being formed in case the via contact hole is formed by using an SOG (spin-on-glass) film as an insulated film.

2. Discussion of the Background

In a conventional semiconductor manufacturing process, a via is formed by reactive ion etching (RIE), plasma etching, etc., Recently a high density plasma etching method has been used in a process for forming the via.

A conventional method for forming a via using the plasma etching method will be described with reference to the accompanying drawings.

FIGS. 1A through 1E are vertical cross-sectional diagrams sequentially illustrating a conventional method for forming a via.

In FIG. 1A, a conductive layer pattern 2 is formed on a base layer 1 on a semiconductor substrate (not shown). A plurality of semiconductor devices (not shown) are formed in the base layer 1. The conductive layer pattern 2 is formed by depositing a conductive layer (not shown) on the base layer 1 and selectively etching the conductive layer using an etching mask.

In FIG. 1B, a first insulating layer 3, a second insulating layer 4, and a third insulating layer 5 are sequentially formed on the base layer 1 having the conductive layer pattern 2 formed thereon. The first insulating film 3 and the third insulating film 5 are formed of $SiO_2$ or $Si_3N_4$, or a combination thereof by CVD, and the second insulating film 4 is formed of a SOG film.

In FIGS. 1C and 1D, a photoresist pattern 6 is formed on the third insulating film 5. Using the photoresist pattern 6 as a mask, a plasma etching process is used to etch the first, second, and third insulating layers 3, 4, 5 to expose an upper surface of the conductive layer pattern 2, thus forming a via 7. Here, the photoresist pattern 6 is formed by forming a photoresist layer (not shown) on the third insulating layer 5 and exposing and developing the photoresist layer . In the plasma etching process, the semiconductor substrate (not shown) having the photoresist pattern 6 formed thereon is placed in a chamber of a plasma etching apparatus (not shown). An etching gas is supplied to the chamber. A plasma generated by applying radio frequency power to the etching gas is vertically flowed to the semiconductor substrate. Here, the photoresist pattern 6 is used as a mask for forming the via 7, and fluorocarbon, hydrofluorocarbon, inert gas, or oxygen, or combination thereof are used as the etching gas.

In FIG. 1E, the photoresist pattern 6 and remains in the via 7 are removed by an $O_2$ plasma treatment, thus completing the conventional method for forming a via. Here, when removing the photoresist pattern 6 and the remains in the via 7, a side surface of the second insulating film 4, the SOG film, which corresponds to a profile of the via 7, is inwardly bowed.

In the above-described conventional method for forming the via, an undercut profile of the via contact hole is formed because the side surface of the SOG film is inwardly bowed by reaction of oxygenic elements of $O_2$ plasma, (applied to removing the photoresist pattern and the remains in the via) and carbonaceous elements of the SOG film.

In addition, when depositing an interconnection metal layer, a profile of the deposited interconnection metal layer consequently has a negative tilt. Therefore, an open circuit state where no connection is made between interconnection metal layers can occur.

Also, in a borderless via contact process, since a marginal portion of a lower metal interconnection layer is partially exposed, the undercut profile of the via contact hole is more seriously formed in the conventional etching process.

SUMMARY OF THE INVENTION

Accordingly, the present invention is directed to a method for forming a via in a semiconductor manufacturing process that obviates the problems occurring in the related art.

An object of the present invention is to provide a method for forming a via in a semiconductor manufacturing process that prevents an exposed profile of an insulating film from being damaged when a photoresist pattern and remains in the via are removed. This is accomplished by forming a protective film over the exposed profile of the insulating film after forming the via contact.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming a via contact hole in a semiconductor manufacturing process includes: forming a base layer on a semiconductor substrate; forming a conductive layer pattern on the base layer; forming an insulating layer on the base layer having the conductive layer pattern formed thereon; selectively etching the insulating layer pattern in order to form a via on an upper surface of the conductive layer; and applying an argon (Ar) plasma treatment in order to form a protective layer over a profile of the via.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

FIGS. 2A through 2F are vertical cross-sectional diagrams sequentially illustrating a method for forming a via according to the present invention.

Figure 1A:
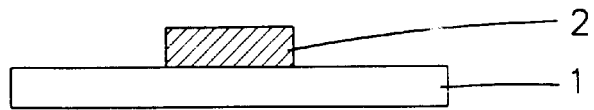
FIGS. 1A through 1E are vertical cross-sectional diagrams sequentially illustrating a conventional method for forming a via.
Figure 1B:
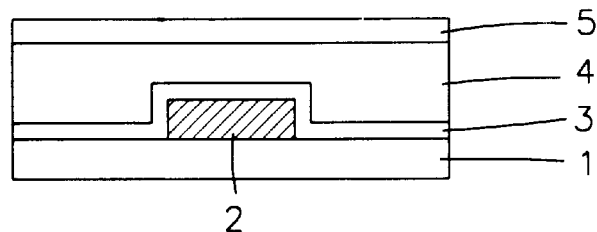
Figure 1C:
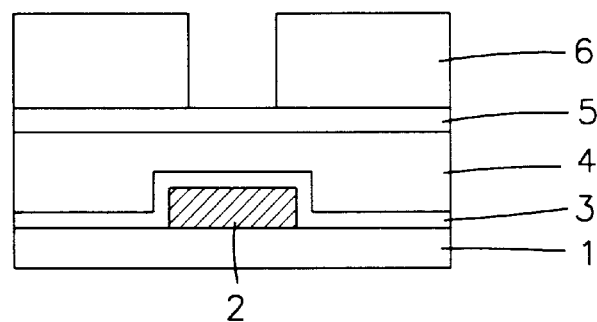
Figure 1D:
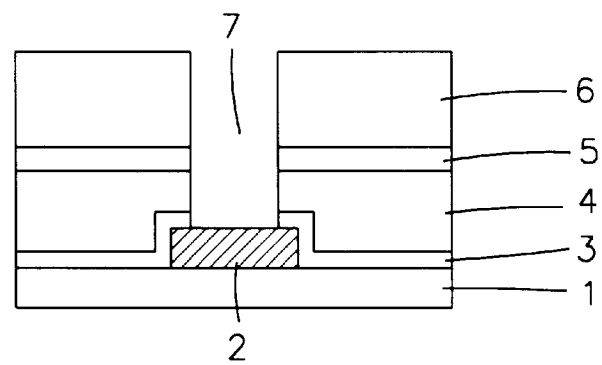
Figure 1E:
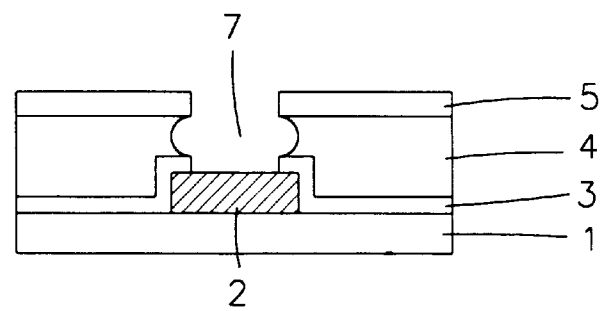
Figure 2A:
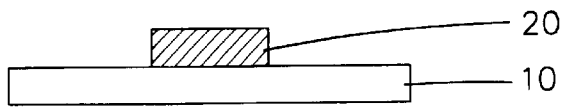
FIGS. 2A through 2F are vertical cross-sectional diagrams sequentially illustrating a method for forming a via according to the present invention.

In FIG. 2A, a conductive layer pattern 20 is formed on a base layer 10 on a semiconductor substrate (not shown). A plurality of semiconductor devices (not shown) are formed in the base layer 10, and the conductive layer pattern 20 is formed by selectively etching a conductive layer (not shown) deposited on the base layer 10, using an etching mask.

Figure 2B:
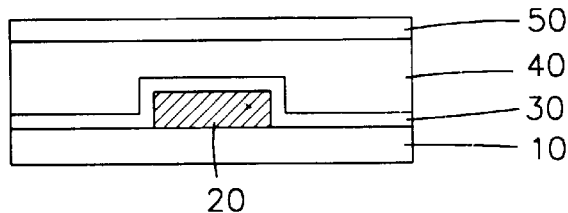

In FIG. 2B, a first insulating layer 30, a second insulating layer 40, and a third insulating layer 50 are sequentially formed over the base layer 10 having the conductive layer pattern 20 formed thereon. The first insulating film 30 and the third insulating film 50 are formed of $SiO_2$, $Si_3N_4$, or a combination thereof using CVD, and the second insulating film 40 is formed of an SOG film.

Figure 2C:
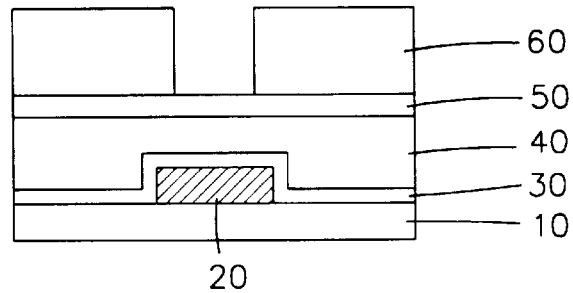
Figure 2D:
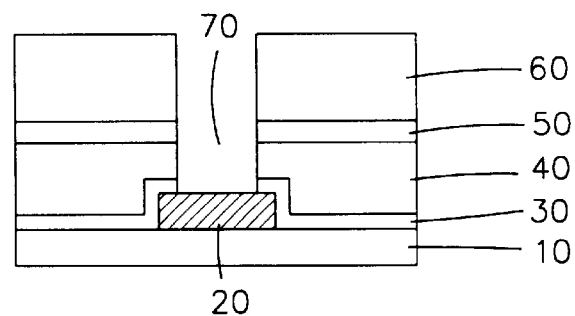

In FIGS. 2C and 2D, a photoresist pattern 60 is formed on the third insulating film 50. Using the photoresist pattern 60 as a mask, a plasma etching process is used to etch the first, second, and third insulating layers 30, 40, 50 to expose an upper surface of the conductive layer pattern 20, thus forming a via 70. Here, the photoresist pattern 60 is formed by exposing and developing a photoresist (not shown) applied on the third insulating layer 50. In the plasma etching process, the semiconductor substrate (not shown) having the photoresist pattern 60 formed thereon is placed in an etching chamber (not shown), an etching gas is supplied into the chamber. Ar plasma generated by applying radio frequency power is vertically flowed to the semiconductor substrate. Here, the photoresist pattern 60 is used as a mask for forming the via 70, and fluorocarbon, hydrofluorocarbon, inert gas, or oxygen, or a combination thereof are used as the etching gas.

Figure 2E:
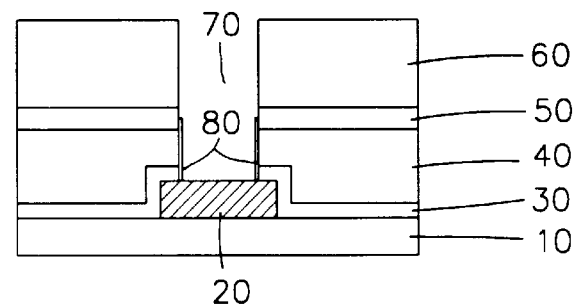

In FIG. 2E, a protective layer 80 is formed at a profile of the via 70. When generating Ar plasma for sputtering effects in the same chamber, the protective layer 80 is formed by partially sputtering the conductive pattern, so protective layer 80 is formed on the sides of via 70.

Figure 2F:
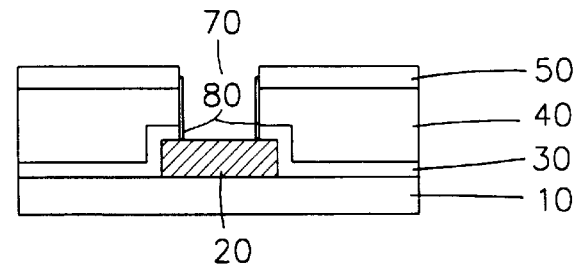

Here, a flow of Ar gas applied during generation of the Ar plasma is from 100 to 200 sccm and the radio frequency power applied thereto ranges from 200 to 500 W. Also, in the Ar plasma, it is desirable to separately adjust the source plasma and the bias plasma. In FIG. 2F, the method according to the present invention is completed by removing the photoresist pattern 60 and remains in the via 70 by applying an oxygen plasma. Here, the protective layer 80 prevents the profile of the via 70, (i.e., the side surface of the second insulated layer 40 which is made from the SOG film), from being inwardly bowed when removing the photoresist pattern 60 and the remains in the via 70. Therefore, the via 70 has a profile with vertically formed sides.

As described above, in the process of forming the via contact hole by using the SOG film as the insulating layer, the method for forming the via according to the present invention includes forming a protective film over the profile of the SOG film, which is exposed by the via contact hole etching process, by applying the Ar plasma treatment. This prevents the via contact hole from having an undercut profile when removing the photoresist pattern, leaving the sides of the via contact hole desirably vertical.

In addition, the method for forming the via according to the present invention improves step coverage when depositing an interconnection metal layer thereafter.

Also, the present invention may obtain the via having vertically formed profile, although a marginal portion of a lower metal interconnection is exposed in a borderless via contact process.

It will be apparent to those skilled in the art that various modifications and variations can be made in the method for forming the via in the semiconductor manufacturing process of the present invention without departing from the spirit or scope of the invention. Thus, it is intended that the present invention cover the modifications and variations of this invention provided they come within the scope of the appended claims and their equivalents.

What is claimed is:

1. A method for forming a via in a semiconductor device, comprising:

forming a conductive layer pattern;

covering the conductive layer pattern with an insulating layer;

selectively etching the insulating layer so as to expose a surface of the conductive layer pattern, thereby forming a via in the insulating layer; and using an argon plasma treatment to partially sputter the exposed surface of the conductive layer pattern so as to form a protective layer over a sidewall of the via.

2. The method according to claim 1, wherein the insulating layer comprises a spin-on-glass (SOG) layer.

3. The method according to claim 2, wherein the insulating layer comprises a first insulating film, a second insulating film, and an SOG layer between the first and second insulating films.

4. The method according to claim 1, wherein using an argon plasma treatment comprises using a radio frequency power between 200 W and 500 W.

5. The method according to claim 1, wherein using an argon plasma treatment comprises supplying argon gas to a reaction chamber at between 100 sccm and 200 sccm, at a pressure of between 10 mTorr and 50 mTorr.

6. The method according to claim 1, further comprising:

forming a photoresist pattern on the insulating layer; and anisotropically etching the insulating layer using the photoresist pattern as a mask.

7. The method of claim 6, wherein anisotropically etching the insulating layer comprises using one of a fluorocarbon, hydrofluorocarbon, and oxygen as an etchant gas.

8. The method according to claim 1, comprising using an oxygen plasma treatment after the argon plasma treatment to strip the via.

9. The method according to claim 8, wherein the argon plasma treatment, the oxygen plasma treatment, and selective etching of the insulating layer are performed in the same reaction chamber.

10. The method according to claim 1, further comprising:

forming a base layer on a semiconductor substrate; and forming the conductive layer pattern on the base layer.

* * * * *